(12) United States Patent
Yang et al.

(10) Patent No.: US 11,999,614 B2
(45) Date of Patent: Jun. 4, 2024

(54) FERROELECTRIC THIN FILM

(71) Applicants: KOREA ADVANCED INSTITUTE OF SCIENCE AND TECHNOLOGY, Daejeon (KR); RESEARCH & BUSINESS FOUNDATION SUNGKYUNKWAN UNIVERSITY, Suwon-si (KR)

(72) Inventors: Heejun Yang, Daejeon (KR); Eunji Hwang, Daejeon (KR); Yonas Assefa Eshete, Suwon-si (KR)

(73) Assignees: KOREA ADVANCED INSTITUTE OF SCIENCE AND TECHNOLOGY, Daejeon (KR); RESEARCH & BUSINESS FOUNDATION SUNGKYUNKWAN UNIVERSITY, Gyeonggi-do (KR)

(*) Notice: Subject to any disclaimer, the term of this patent is extended or adjusted under 35 U.S.C. 154(b) by 0 days.

(21) Appl. No.: 18/151,810

(22) Filed: Jan. 9, 2023

(65) Prior Publication Data
US 2023/0399229 A1 Dec. 14, 2023

(30) Foreign Application Priority Data
Jun. 10, 2022 (KR) .................. 10-2022-0070579

(51) Int. Cl.
*H01B 1/06* (2006.01)
*B32B 15/01* (2006.01)
(Continued)

(52) U.S. Cl.
CPC ............ *C01B 19/002* (2013.01); *B32B 15/01* (2013.01); *H01B 1/06* (2013.01); *B32B 2307/302* (2013.01); *C01P 2002/76* (2013.01); *C01P 2002/77* (2013.01); *C01P 2006/32* (2013.01); *C01P 2006/40* (2013.01); *C01P 2006/42* (2013.01); *H01L 28/40* (2013.01); *H01L 29/1606* (2013.01); *H01L 29/78391* (2014.09)

(58) Field of Classification Search
CPC .......... H01B 1/00; H01B 1/06; C01B 19/002; H01L 29/78391
See application file for complete search history.

(56) References Cited

U.S. PATENT DOCUMENTS 10,811,601 B2 * 10/2020 Gambin ............ H01L 21/28088

FOREIGN PATENT DOCUMENTS

KR 102196693 B1 12/2020
TW 201905231 A 2/2019

OTHER PUBLICATIONS

Yuan et al "A review of ultra-thin ferroelectric films", J. Phys,: Condens. Matter 33 (2021) 403003 (15 pp).*
(Continued)

*Primary Examiner* — Mark Kopec
(74) *Attorney, Agent, or Firm* — Harness, Dickey & Pierce, P.L.C.

(57) ABSTRACT

Provided is a thin film including $Mo_{1-x}W_xTe_2$ stacked in a plurality of layers. The thin film has a thickness of about 1 nm to about 100 nm in a stacking direction, has a symmetric lattice structure at a temperature higher than a threshold temperature, and has an asymmetric lattice structure at a temperature equal to or lower than the threshold temperature.

19 Claims, 9 Drawing Sheets

(51) Int. Cl.
 C01B 19/00 (2006.01)
 H01L 29/16 (2006.01)
 H01L 29/78 (2006.01)
 H01L 49/02 (2006.01)

(56) References Cited

OTHER PUBLICATIONS

Deng et al "Controlled synthesis of MoxW1—xTe2 atomic layers with emergent quantum states", ACS Nano 2021, 15, 11526-11534.*
Schneeloch et al "Evolution of the structural transition in Mo1—xWxTe2", Physical Review B 102, 054105 (2020).*
Nyby et al "Visualizing energy transfer at buried interfaces in layered materials using picosecond X-rays", Adv. Funct. Mater. 2020, 30, 2002282 (7 pages).*
Yuan et al "Room-temperature ferroelectricity in MoTe2 down to the atomic monolayer unit", Mature Communications (2019) 10: 1775.*
Gan et al "Order-disorder phase transitions in the two-dimensional semiconducting transition metal dichalcogedide alloys Mo1—xWxX2 (X-S, Se, and Te)", Scientific Reports 4:6691 (pub Oct. 2014).*
Hou et al "Strain-based room-temperature non-volatile MoTe2 ferroelectric phase change transistor", Nature Nanotechnology vol. 14, Jul. 2019, 668-673.*
Rhodes et al "Engineering the structural and electronic phases of MoTe2 through W substitution", Nano Lett. 2017, 17, 1616-1622.*
Zhang et al "Two-Dimensional Van Der Waals Topological Materials: Preparation, Properties, and Device Applications", Small 2022, 18, 2204380.*
Sean M Oliver, et al. "The structural phases and vibrational properties of Mo1?xWxTe2 alloys", 2D Mater. 4 (2017) 045008.
Zaiyao Fei et al., "Ferroelectric switching of a two-dimensionalmetal", Nature 560, 336 (2018).
Pankaj Sharma et al., "A room-temperature ferroelectric semimetal", Science Advances 5, 5080 (2019).
Shuoguo Yuan et al., "Room-temperature ferroelectricity in MoTe2 down to the atomic monolayer limit", Nature Communications 10, 1775 (2019).

* cited by examiner

FERROELECTRIC THIN FILM

CROSS-REFERENCE TO RELATED APPLICATIONS

This U.S. non-provisional patent application claims priority under 35 U.S.C. § 119 of Korean Patent Application No. 10-2022-0070579, filed on Jun. 10, 2022, the entire contents of which are hereby incorporated by reference.

BACKGROUND

The present disclosure herein relates to a thin film, and more particularly, to a ferroelectric thin film.

With the development of modern industry, electronic devices are more highly integrated. For high integration of electronic devices, materials used in electronic devices are required to be refined. However, in the case of ferroelectrics that may be widely applied to next-generation electronic devices, it is difficult to control ferroelectricity in an atomic-level thin film using current technology. Accordingly, researches for the refinement of ferroelectrics are actively carried out.

SUMMARY

The present disclosure provides a thin film having ferroelectricity at room temperature.

The purposes of the present disclosure are not limited to the above-mentioned purposes, and other purposes not mentioned would be clearly understood by those skilled in the art from the disclosure below.

An embodiment of the inventive concept provides a thin film including $Mo_{1-x}W_xTe_2$ stacked in a plurality of layers, wherein the thin film may have a thickness of about 1 nm to about 100 nm in a stacking direction, have a symmetric lattice structure at a temperature higher than a threshold temperature, and have an asymmetric lattice structure at a temperature equal to or lower than the threshold temperature.

In an embodiment of the inventive concept, a thin film includes $Mo_{1-x}W_xTe_2$ stacked in a plurality of layers, wherein the thin film may have a thickness of about 1 nm to about 100 nm in a stacking direction, have ferroelectricity at a temperature equal to or lower than a threshold temperature, and have a degree of polarization which increases as the temperature equal to or lower than the threshold temperature decreases when x is constant.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, thin films according to embodiments of the inventive concept and features thereof will be described in detail.

Transition metal dichalcogenide (TMD) may have a polymorphism characteristic. For example, the TMD may have a most stable phase at a particular temperature and pressure by controlling electrical doping, chemical pressure, and/or mechanical deformation. Through this control, the TMD may exhibit various characteristics required in various fields. This control may be defined by polymorphic engineering, wherein the polymorphic engineering may be used to correct symmetry of electronic structure and lattice of the TMD. Ferroelectricity of the TMD may be controlled by correcting the symmetry of electronic structure, lattice, and thickness of the TMD through the polymorphic engineering, and the TMD of a thin film type may be provided as a ferroelectric.

Figure 1:
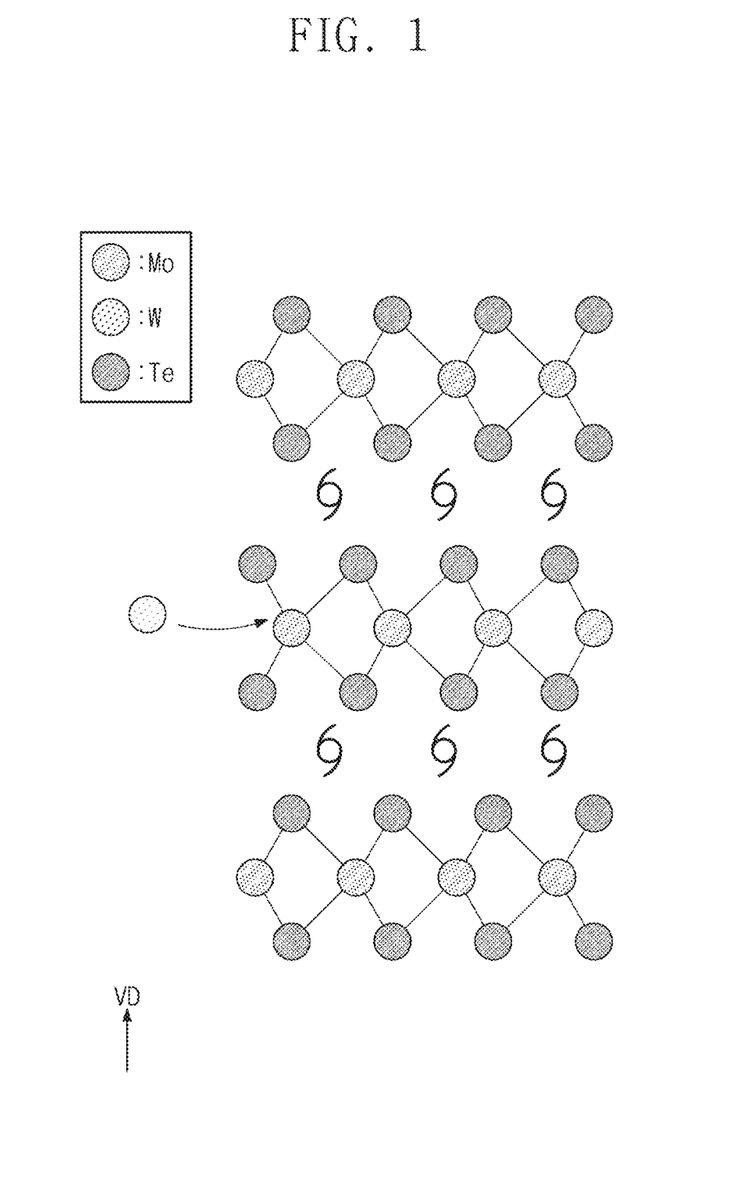
FIGS. 1 to 3 are diagrams illustrating a lattice structure of a thin film according to embodiments of the inventive concept.
Figure 2:
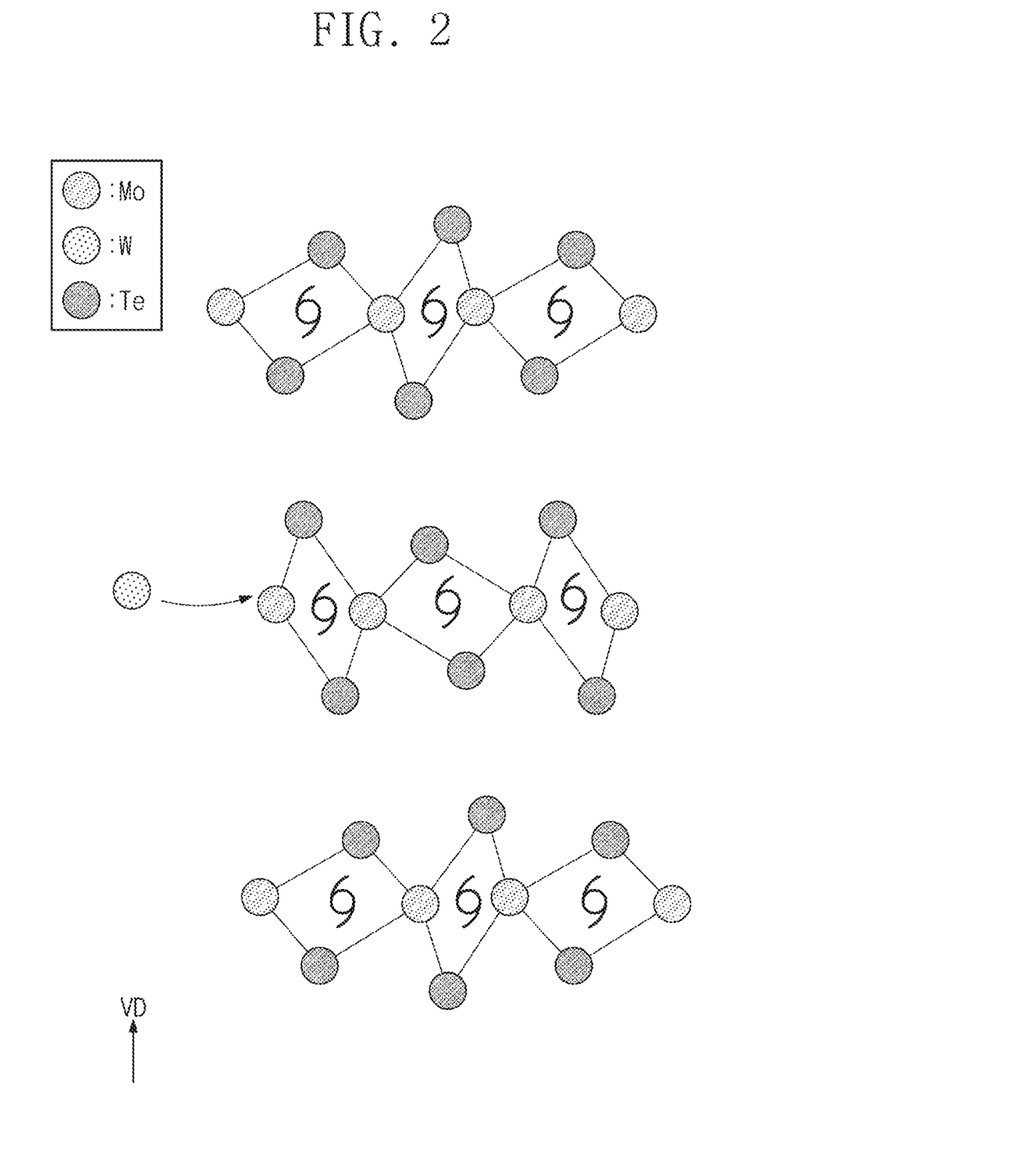
Figure 3:
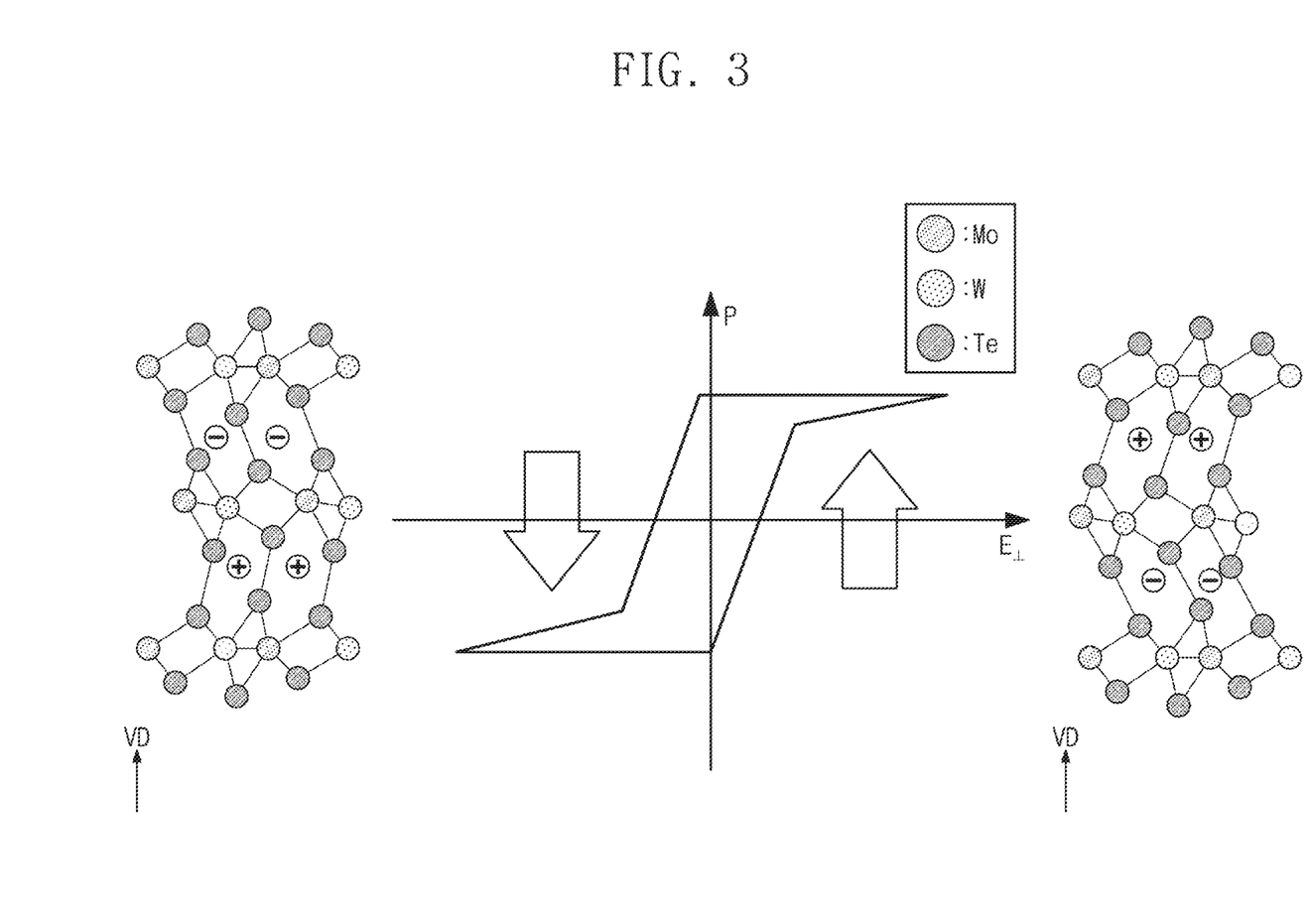

FIGS. 1 to 3 are diagrams illustrating a lattice structure of a thin film according to embodiments of the inventive concept.

Referring to FIGS. 1 to 3, $Mo_{1-x}W_xTe_2$, which is one type of TMD, may be provided as a ferroelectric thin film. The $Mo_{1-x}W_xTe_2$ may have a polymorphism characteristic at a room temperature (e.g., 300 K). The $Mo_{1-x}W_xTe_2$ may have various lattice structures according to a value of x. As illustrated in FIGS. 1 to 3, the $Mo_{1-x}W_xTe_2$ stacked in a vertical direction VD may have various lattice structures by controlling temperature and the value of x. Accordingly, the $Mo_{1-x}W_xTe_2$ may be provided as a ferroelectric by controlling temperature and the value of x.

For example, as illustrated in FIG. 1, the $Mo_{1-x}W_xTe_2$ may have a hexagonal structure (2H structure), which is a symmetric lattice structure, at a room temperature. The 2H structure may be a centrosymmetric crystal structure having a two-fold screw inversion center. The $Mo_{1-x}W_xTe_2$ of the 2H structure may have non-polarity and semiconductor properties. Here, x may be less than 0.1. That is, the $Mo_{1-x}W_xTe_2$ may be a material in which portion (less than 10%) of Mo of $MoTe_2$ is replaced with W. A symmetric structure may be maintained since only a small amount of Mo among all Mo is replaced with W.

For another example, as illustrated in FIG. 2, the $Mo_{1-x}W_xTe_2$ may have a monoclinic structure (1T' structure), which is a symmetric lattice structure, at a room temperature. The 1T' structure may be a centrosymmetric crystal structure having a two-fold screw inversion center. The $Mo_{1-x}W_xTe_2$ of the 1T' structure may have non-polarity and conductivity. For example, the $Mo_{1-x}W_xTe_2$ of the 1T' structure may have conductivity equivalent to that of metal. Here, x may be at least 0.1 and less than 0.4. That is, the $Mo_{1-x}W_xTe_2$ may be a material in which portion (about 10% to about 40%) of Mo of $MoTe_2$ is replaced with W. Although a larger amount of Mo is replaced to W compared to the 2H structure, the $Mo_{1-x}W_xTe_2$ may also maintain symmetry in the 1T' structure. However, since a larger amount of W, which is metal, is included compared to the case where x is less than 0.1, the $Mo_{1-x}W_xTe_2$ of the 1T' structure may have conductivity.

For another example, as illustrated in FIG. 3, the $Mo_{1-x}W_xTe_2$ may have an orthorhombic structure ($T_d$ structure), which is an asymmetric lattice structure, at a room temperature. Here, x may be at least 0.4 and less than 1. Since a majority of Mo atoms of the $Mo_{1-x}W_xTe_2$ are replaced with W atoms having a larger size, the $Mo_{1-x}W_xTe_2$ may lose symmetry. Accordingly, the $Mo_{1-x}W_xTe_2$ of the $T_d$ structure may have polarity.

The $Mo_{1-x}W_xTe_2$ of the $T_d$ structure may exhibit P-E hysteresis as an electric field is applied thereto. When a direction of the electric field is changed, a polarization direction of the $Mo_{1-x}W_xTe_2$ of the $T_d$ structure may be changed (e.g., reversed). Even if the electric field becomes zero, the $Mo_{1-x}W_xTe_2$ of the $T_d$ structure may maintain a polarization state. That is, the $Mo_{1-x}W_xTe_2$ of the $T_d$ structure may have ferroelectricity.

As described above, the $Mo_{1-x}W_xTe_2$ may have non-polarity or polarity according to a particular x value and temperature. Hereinafter, a lattice structure of the $Mo_{1-x}W_xTe_2$ according to the x value and temperature will be described with reference to FIGS. 4 and 5.

Figure 4:
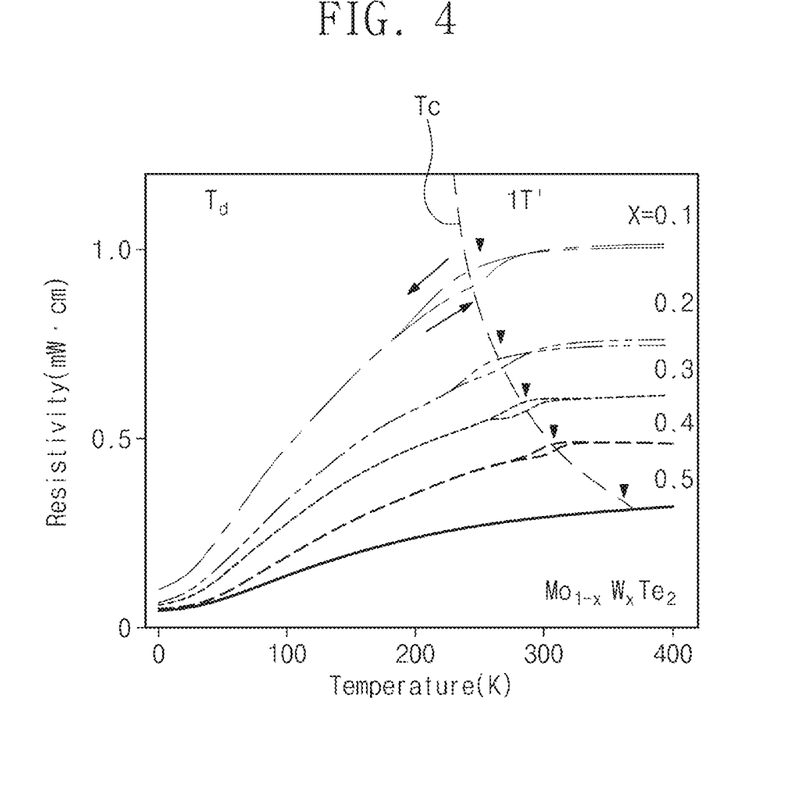
FIG. 4 is a graph illustrating a resistance value and lattice structure of a $Mo_{1-x}W_xTe_2$ thin film according to temperature.

FIG. 4 is a graph illustrating a resistance value and lattice structure of a $Mo_{1-x}W_xTe_2$ thin film according to temperature.

Referring to FIG. 4, the $Mo_{1-x}W_xTe_2$ may have the $T_d$ structure or 1T' structure when x have a value of 0.1 to 0.5. The $T_d$ structure may be provided at a relatively low temperature compared to the 1T' structure. A threshold temperature Tc may be defined as a phase transition temperature at which the $Mo_{1-x}W_xTe_2$ changes from the $T_d$ structure to the 1T' structure or from the 1T' structure to the $T_d$ structure, and the threshold temperature Tc may have different values at different x values. In other words, the value of the threshold temperature may vary when x changes. For example, as illustrated in FIG. 4, the threshold temperature Tc may increase as x increases within a range of 0.1 to 0.5. In this case, the $Mo_{1-x}W_xTe_2$ may have the $T_d$ structure at a higher temperature as the x value is closer to 0.5. This is because asymmetry of the $Mo_{1-x}W_xTe_2$ increases as a ratio between Mo and W in the $Mo_{1-x}W_xTe_2$ is closer to 1:1. On the contrary, although not illustrated, the threshold temperature Tc may decrease as x increases when W is higher than Mo (i.e., x is larger than 0.5).

The $Mo_{1-x}W_xTe_2$ may have the $T_d$ structure (i.e., asymmetric lattice structure) at a temperature equal to or lower than the threshold temperature Tc. Therefore, the $Mo_{1-x}W_xTe_2$ may have ferroelectricity at a temperature equal to or lower than the threshold temperature Tc. For example, as illustrated in FIG. 4, the threshold temperature Tc may be at least a room temperature (e.g., 300 K) when x is at least 0.4. Here, the $Mo_{1-x}W_xTe_2$ may have the $T_d$ structure at a room structure, and thus may have ferroelectricity at a room temperature.

The $Mo_{1-x}W_xTe_2$ may have the 1T' structure (i.e., symmetric lattice structure) at a temperature higher than the threshold temperature Tc. Therefore, the $Mo_{1-x}W_xTe_2$ may have conductivity equivalent to that of metal at a temperature higher than the threshold temperature Tc.

The $Mo_{1-x}W_xTe_2$ may be a ferroelectric based on a conductive material, unlike a typical ferroelectric based on an insulating material. An insulating material-based ferroelectric may have a limitation in forming a thin film of a certain thickness or less due to mismatch between lattices and dangling bond. However, the $Mo_{1-x}W_xTe_2$, which is a two-dimensional conductive material, may overcome the limitation of an insulating material-based ferroelectric, such as the mismatch between lattices and dangling bond. As a result, a thin film-type ferroelectric having a thin thickness may be easily formed. However, when electrons are accumulated to at least a certain degree in the $Mo_{1-x}W_xTe_2$, the $Mo_{1-x}W_xTe_2$ may not have ferroelectricity due to a screening effect of electrons or the like.

As the x value increases, resistance of the $Mo_{1-x}W_xTe_2$ may reduce at the same temperature. This is because a proportion of W, which is a metal material, increases in the $Mo_{1-x}W_xTe_2$, thus reducing the resistance of the $Mo_{1-x}W_xTe_2$.

As temperature increases, the resistance of the $Mo_{1-x}W_xTe_2$ may increase at the same value of x. When temperature increases, this phenomenon may occur since the $Mo_{1-x}W_xTe_2$ phase transitions to the 1T' structure having properties of metal, and metal has high resistance at a high temperature.

Figure 5:
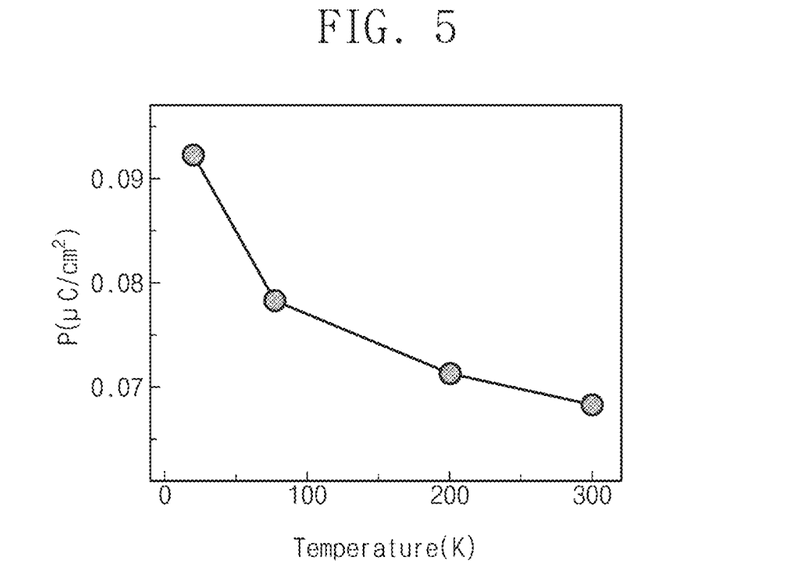
FIG. 5 is a graph illustrating a degree of polarization of a $Mo_{0.5}W_{0.5}Te_2$ thin film according to temperature.

FIG. 5 is a graph illustrating a degree of polarization of a $Mo_{0.5}W_{0.5}Te_2$ (i.e., x=0.5) thin film according to temperature.

Referring to FIG. 5, when x=0.5, the degree of polarization of the $Mo_{0.5}W_{0.5}Te_2$ may reduce as the temperature increases within a range below the threshold temperature Tc. This is because the $T_d$ structure having polarity phase transitions to the non-polar 1T' structure as the temperature increases, thus reducing polarity of the $Mo_{0.5}W_{0.5}Te_2$. However, the $Mo_{1-x}W_xTe_2$ may exhibit a polarization state at a room temperature (e.g., 300 K).

Figure 6:
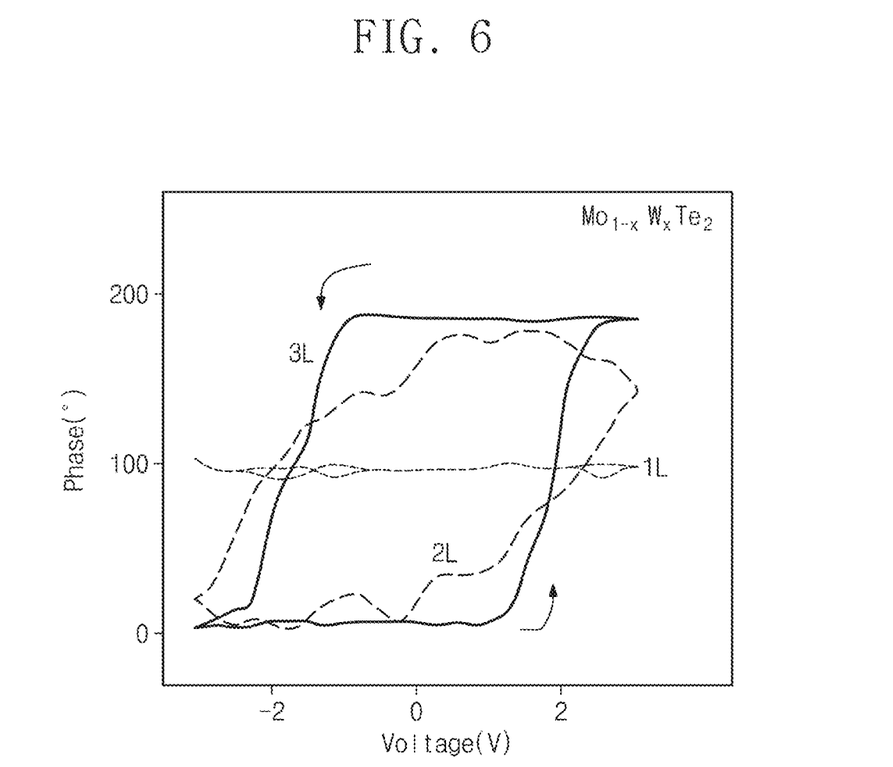
FIG. 6 is a graph illustrating a PFM analysis result according to a layer number of a $Mo_{0.5}W_{0.5}Te_2$ thin film.

FIG. 6 is a graph illustrating a PFM analysis result according to a layer number of $Mo_{0.5}W_{0.5}Te_2$ in a thin film. Hereinafter, ferroelectricity of the $Mo_{0.5}W_{0.5}Te_2$ according to a layer number and thickness thereof will be described with reference to FIG. 6.

Referring to FIG. 6, a phase of the $Mo_{0.5}W_{0.5}Te_2$ changes according to a voltage at a room temperature. When the $Mo_{0.5}W_{0.5}Te_2$ has a single layer 1L along the vertical direction VD of FIG. 1, a hysteresis loop according to a voltage may not appear. In other words, although the $Mo_{0.5}W_{0.5}Te_2$ has the $T_d$ structure at a room temperature (see FIG. 4), the $Mo_{0.5}W_{0.5}Te_2$ of the single layer 1L may not have ferroelectricity. However, when the $Mo_{0.5}W_{0.5}Te_2$ is stacked in two layers 2L or three layers 3L, the hysteresis loop according to a voltage may appear unlike the case where the $Mo_{0.5}W_{0.5}Te_2$ is the single layer 1L. That is, the $Mo_{0.5}W_{0.5}Te_2$ of the two layers 2L or three layers 3L may have ferroelectricity.

The $Mo_{0.5}W_{0.5}Te_2$ of the single layer 1L may have a thickness (e.g., about 0.6 nm) less than about 1 nm in a stacking direction of the $Mo_{0.5}W_{0.5}Te_2$ of the two layers 2L or three layers 3L. The $Mo_{0.5}W_{0.5}Te_2$ of the two layers 2L or three layers 3L may have a thickness larger than about 1 nm in the stacking direction. That is, when the thickness of the $Mo_{0.5}W_{0.5}Te_2$ is at least about 1 nm, the $Mo_{0.5}W_{0.5}Te_2$ may have ferroelectricity. However, when the thickness of the $Mo_{0.5}W_{0.5}Te_2$ is larger than about 100 nm, the $Mo_{0.5}W_{0.5}Te_2$ may not exhibit ferroelectricity within a range of a drive voltage of an electronic device such as a semiconductor device.

Figure 7:
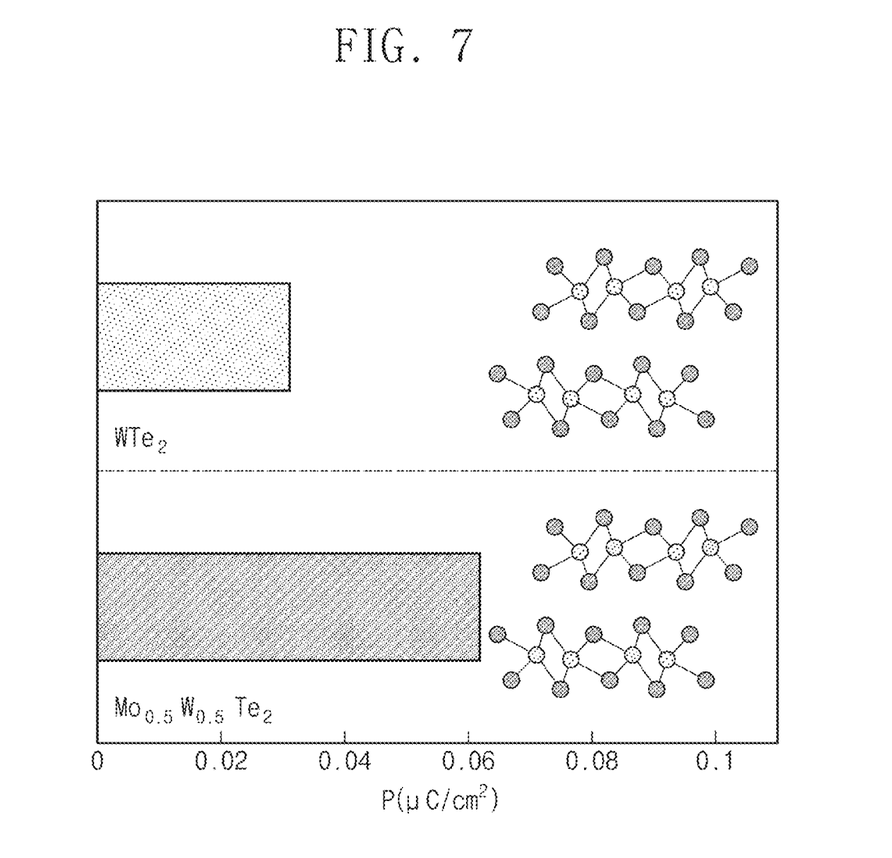
FIG. 7 is a graph illustrating a comparison of a degree of polarization between thin films calculated according to Equation 1.

FIG. 7 is a graph illustrating a comparison of a degree of polarization between thin films calculated according to Equation 1.

The degree of polarization of the $Mo_{1-x}W_xTe_2$ may be calculated through Equation 1 below.

$$P_z = \left(\frac{1}{S}\right)\left(\sum_i Z_i R_{i,z} + e\int_{V_i} z n_e(x,y,z)\,dx\,dy\,dz\right) \quad \text{[Equation 1]}$$

S may denote an area of a unit cell having a volume of V. $Z_i$ and $n_e(x,y,z)$ may respectively denote an ion charge and electron density. $R_{i,z}$ may denote a position of an i-th ion relative to z element in a unit cell. A value calculated through Equation 1 indicates the degree of polarization at 0 K.

Referring to FIG. 7, although $WTe_{2-}$ (i.e., x=1) has properties of metal, $WTe_{2-}$ may exhibit polarization. The degree of polarization of the $WTe_{2-}$ calculated according to Equation 1 is about 0.031 µC/cm². The degree of polarization of the $Mo_{0.5}W_{0.5}Te_2$ (i.e., x=0.5) may be higher than that of the $WTe_2$. The degree of polarization of the $Mo_{0.5}W_{0.5}Te_2$ calculated according to Equation 1 is about 0.062 µC/cm₂. This shows that when a ratio between Mo and W is appropriately controlled, a symmetric lattice form may be destroyed, and the $Mo_{1-x}W_xTe_2$ may have stronger polarity.

Figure 8:
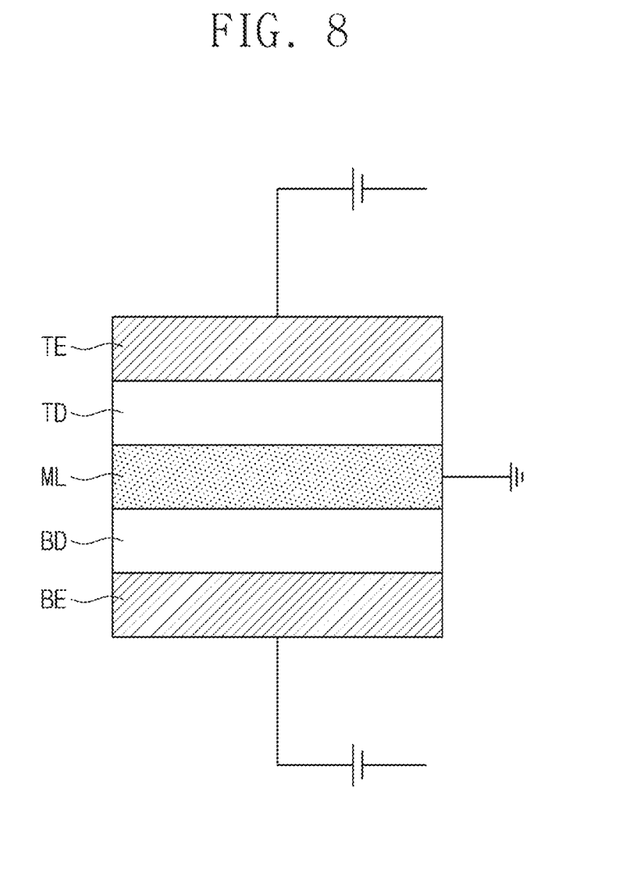
FIG. 8 schematically illustrates a device according to Experimental Example 1.
Figure 9:
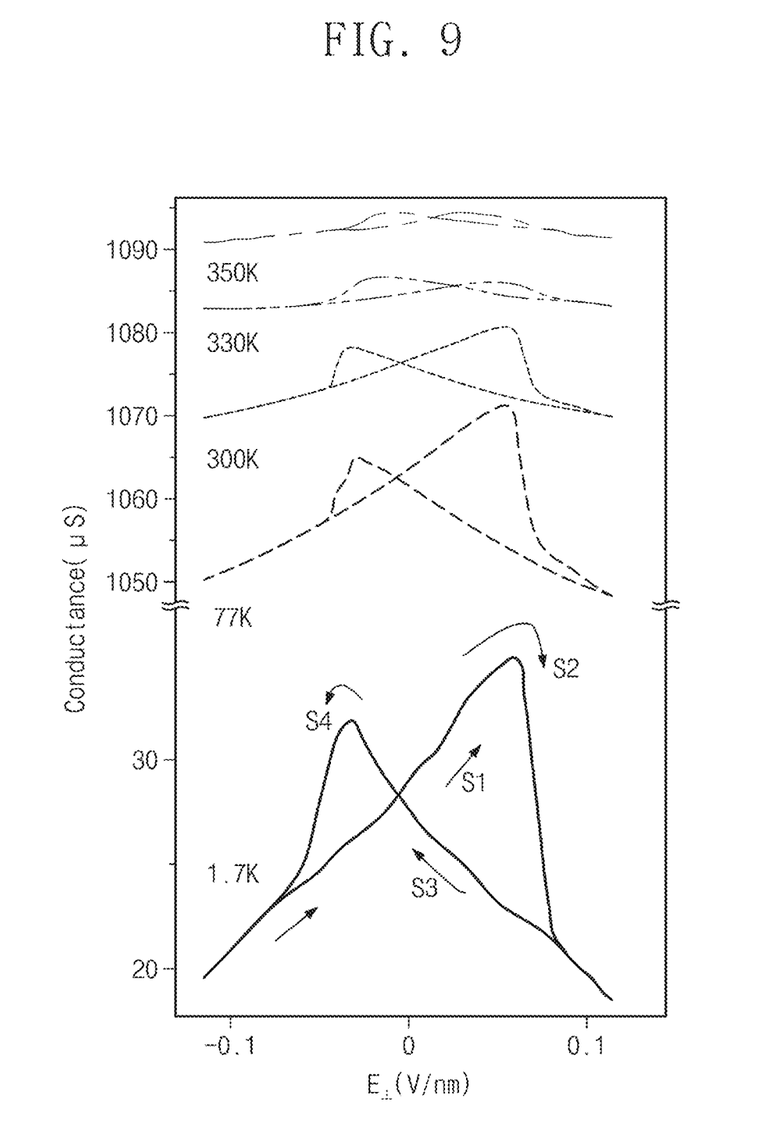
FIG. 9 is a graph illustrating conductance of a $Mo_{0.5}W_{0.5}Te_2$ thin film according to an electric field in a device according to Experimental Example 1.

FIG. 8 schematically illustrates a device according to Experimental Example 1. FIG. 9 is a graph illustrating conductance of a $Mo_{0.5}W_{0.5}Te_2$ thin film according to an electric field in a device according to Experimental Example 1. Hereinafter, a conductance change of the $Mo_{0.5}W_{0.5}Te_2$ according to the electric field in the device according to Experimental Example 1 will be described.

Experimental Example 1

Referring to FIG. 8, a thin film material layer ML, which is subject to conductance measurement, is interposed between an upper electrode TE and a lower electrode BE. An upper dielectric layer TD is interposed between the thin film material layer ML and the upper electrode TE. A lower dielectric layer BD is interposed between the thin film material layer ML and the lower electrode BE. The thin film material layer ML includes a $Mo_{0.5}W_{0.5}Te_2$ thin film stacked in two layers. The upper electrode TE and the lower electrode BE include graphite. The upper dielectric layer TD and the lower dielectric layer BD include hexagonal boron nitride (hBN).

An electric field is applied to the thin film material layer ML in a stacking direction by providing a voltage to the upper electrode TE and the lower electrode BE. The electric field is calculated through Equation 2 below.

$$E = \left(\left(\frac{V_b}{d_b}\right) - \left(\frac{V_t}{d_t}\right)\right)/2 \quad \text{[Equation 2]}$$

E denotes an electric field applied to the thin film material layer ML. $V_b$ denotes a voltage on the lower electrode BE, and $V_t$ denotes a voltage on the upper electrode TE. $d_t$ denotes a thickness of the upper dielectric layer TD, and $d_b$ denotes a thickness of the lower dielectric layer BD. A magnitude of the electric field transferred to the thin film material layer ML may be controlled by controlling $V_t$ and $V_b$. At the same time, a current is connected to the thin film material layer ML to measure conductance in the thin film material layer ML according to a change in temperature and the electric field. The conductance change according to the temperature was measured at 1.7 K, 77 K, 300 K, 330 K, and 350 K.

Referring to FIG. 9, the thin film material layer ML has a conductance hysteresis loop according to a change in the electric field. For example, at a temperature of 1.7 K, the conductance of the thin film material layer ML increases as the electric field gradually increases from 0 (S1). However, when the electric field exceeds a particular value (about 0.08 V/nm), the conductance of the thin film material layer ML sharply reduces (S2). When the electric field is increased gradually in an opposite direction, the conductance of the thin film material layer ML increases gradually (S3), and then sharply reduces again when the electric field of the opposite direction exceeds a particular value (about −0.04 V/nm) (S4).

This shows that the thin film material layer ML is a material having ferroelectricity. Since the thin film material layer ML is electrically polarized, an electron flow in the thin film material layer ML may be interfered with by the polarization. Therefore, when an external electric field is strongly applied in a direction opposite to the polarization of the thin film material layer ML, the electron flow may be facilitated, thus increasing the conductance of the thin film material layer ML (S1, S3). However, when a value of the external electric field exceeds a particular value, electric moment in the thin film material layer ML is aligned in the direction of the external electric field. Therefore, the thin film material layer ML may be polarized in a direction (i.e., direction of the external electric field) opposite to previous polarization, and the electron flow may be interfered with more seriously as the external electric field becomes stronger. As a result, when the external electric field, which exceeds a particular value, is applied, the conductance of the thin film material layer ML reduces sharply (S2, S4).

This phenomenon is more clearly observed when the temperature is lower. This is because the thin film material layer ML is closer to the symmetric 1T' structure as the temperature increases, as described above with reference to FIG. 4. However, it may be confirmed that the thin film material layer ML including $Mo_{0.5}W_{0.5}Te_2$ has polarity also at a high temperature (350 K) higher than a room temperature (e.g., 300 K).

Figure 10:
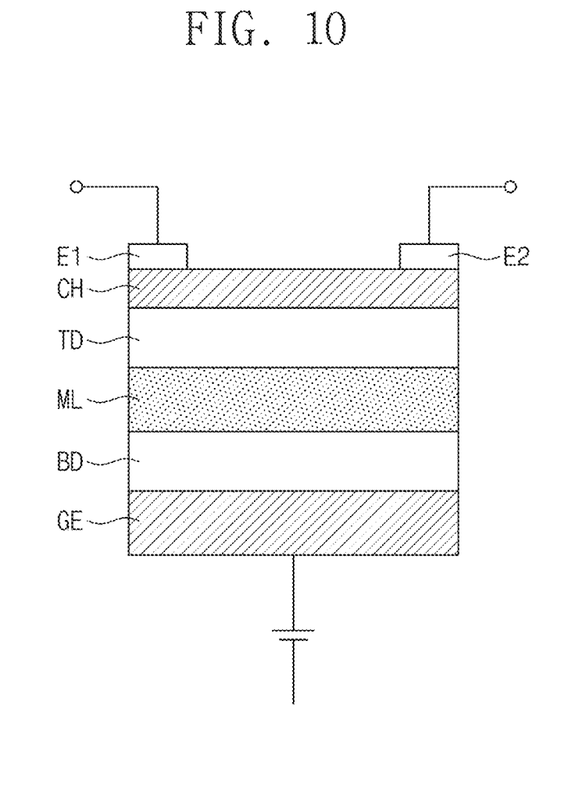
FIG. 10 schematically illustrates a device according to Experimental Example 2.
Figure 11:
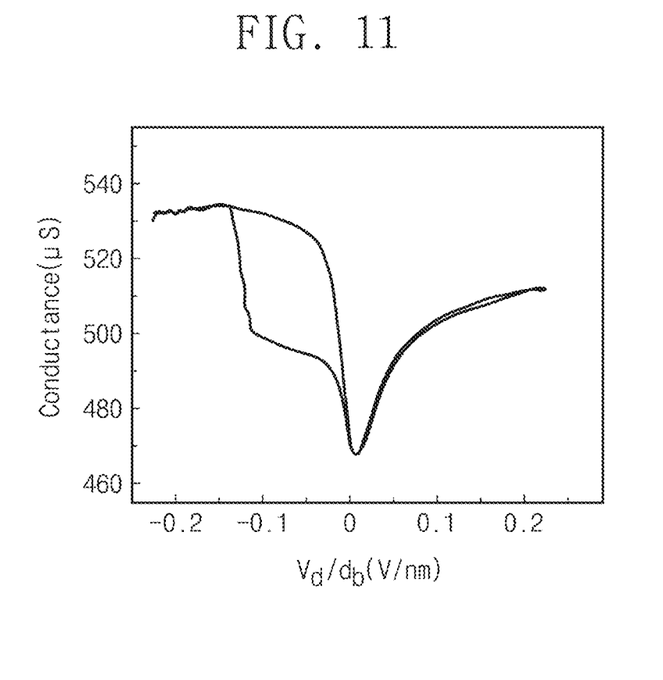
FIG. 11 is a graph illustrating conductance of a channel layer in a device according to Experimental Example 2.

FIG. 10 schematically illustrates a device according to Experimental Example 2. FIG. 11 is a graph illustrating conductance of a channel layer in a device according to Experimental Example 2. Hereinafter, a conductance change of the channel layer in the device according to Experimental Example 2 will be described.

Experimental Example 2

Referring to FIG. 10, the thin film material layer ML is interposed between a gate electrode GE and a channel layer CH. An upper dielectric layer TD is interposed between the thin film material layer ML and the channel layer CH. A lower dielectric layer BD is interposed between the thin film material layer ML and the gate electrode GE. The thin film material layer ML includes a $Mo_{0.5}W_{0.5}Te_2$ thin film stacked in two layers. The channel layer CH includes graphene. A first electrode E1 and a second electrode E2 are connected to the channel layer CH at two ends of the channel layer CH so that the conductance of the channel layer CH may be measured.

Referring to FIGS. 10 and 11, when a gate voltage Vb is applied to the gate electrode GE, the conductance of the channel layer CH changes. This shows that the thin film material layer ML has ferroelectricity.

In detail, when a voltage is applied to the gate electrode GE, polarization occurs in the thin film material layer ML having ferroelectricity. Therefore, an electric field is applied to the channel layer CH. A magnitude of the electric field is proportional to a value (hereinafter referred to as a first value) obtained by dividing the gate voltage Vb by a distance (e.g., thickness of the lower dielectric layer BD) between the gate electrode GE and the thin film material layer ML.

For example, when the electric field of an upward direction is applied to the channel layer CH when the first value is −0.1, the conductance of the channel layer CH gradually increases as the first value becomes closer to −0.2. Here, when the first value changes back to 0, a polarization direction of the thin film material layer ML is reversed when the first value is about −0.1, and the electric field of a downward direction is applied to the channel layer CH. Therefore, the conductance of the channel layer CH reduces sharply. Thereafter, when the first value is changed back from 0 to −0.2, the polarization direction of the thin film material layer ML is reversed when the first value is about −0.1, and the electric field of an upward direction is applied to the channel layer CH. Therefore, the conductance of the channel layer CH increases sharply. When the first value changes from 0 to 0.2, the polarization direction in the thin film material layer ML is maintained constant, and thus the conductance of the channel layer CH increases regularly.

By controlling a thickness along the stacking direction and an x value in $Mo_{1-x}W_xTe_2$, a thin film having ferroelectricity at room temperature or higher may be provided. The thin film is a ferroelectric based on a conductive material, and may overcome technical limitations pertaining to reduction of a thickness of an insulating material-based ferroelectric. As a result, refined ferroelectric thin films may be applied in various industrial fields.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. An electronic device comprising:
a thin film material layer including a first surface and a second surface opposing each other;
an upper electrode on the first surface of the thin film material layer;
a lower electrode on the second surface of the thin film material layer; and
a channel layer between the thin film material layer and the upper electrode,
wherein the thin film material layer includes $Mo_{1-x}W_xTe_2$ stacked in a plurality of layers, where x is at least 0.4 and less than 1,
the $Mo_{1-x}W_xTe_2$ has a thickness of about 1 nm to about 100 nm in a stacking direction,
the $Mo_{1-x}W_xTe_2$ has a symmetric lattice structure at a temperature higher than a threshold temperature,
the $Mo_{1-x}W_xTe_2$ has an asymmetric lattice structure at a temperature equal to or lower than the threshold temperature, and
the upper electrode includes a pair of electrodes connected to the channel layer.

2. The electronic device of claim 1, wherein the thin film material layer has conductivity at the temperature higher than the threshold temperature.

3. The electronic device of claim 1, wherein the $Mo_{1-x}W_xTe_2$ has a monoclinic structure at the temperature higher than the threshold temperature.

4. The electronic device of claim 1, wherein the $Mo_{1-x}W_xTe_2$ has ferroelectricity at the temperature equal to or lower than the threshold temperature.

5. The electronic device of claim 4, wherein a degree of polarization increases as the temperature equal to or lower than the threshold temperature decreases when x is constant.

6. The electronic device of claim 1, wherein the $Mo_{1-x}W_xTe_2$ has an orthorhombic structure at the temperature equal to or lower than the threshold temperature.

7. The electronic device of claim 1, wherein the threshold temperature is at least 300 K.

8. The electronic device of claim 1, wherein the threshold temperature varies when x changes in the $Mo_{1-x}W_xTe_2$.

9. The electronic device of claim 8,
wherein x is 0.5 or less, and
the threshold temperature increases as x increases.

10. A electronic device comprising:
a thin film material layer including a first surface and a second surface opposing each other;
an upper electrode on the first surface of the thin film material layer;
a lower electrode on the second surface of the thin film material layer; and
a channel layer between the thin film material layer and the upper electrode,
wherein the thin film material layer includes $Mo_{1-x}W_xTe_2$ stacked in a plurality of layers, where x is at least 0.4 and less than 1,
the $Mo_{1-x}W_xTe_2$ has a thickness of about 1 nm to about 100 nm in a stacking direction,
the $Mo_{1-x}W_xTe_2$ has ferroelectricity at a temperature equal to or lower than a threshold temperature,
the $Mo_{1-x}W_xTe_2$ has a degree of polarization which increases as the temperature equal to or lower than the threshold temperature decreases when x is constant, and
the upper electrode includes a pair of electrodes connected to the channel layer.

11. The electronic device of claim 10, wherein the threshold temperature varies when a value of x changes in the $Mo_{1-x}W_xTe_2$.

12. The electronic device of claim 11,
wherein x is 0.5 or less, and
the threshold temperature increases as x increases.

13. The electronic device of claim 10, wherein the $Mo_{1-x}W_xTe_2$ has a symmetric lattice structure at a temperature higher than the threshold temperature.

14. The electronic device of claim 13, wherein the $Mo_{1-x}W_xTe_2$ has a monoclinic structure at the temperature higher than the threshold temperature.

15. The electronic device of claim 10, wherein the $Mo_{1-x}W_xTe_2$ has an asymmetric lattice structure at the temperature equal to or lower than the threshold temperature.

16. The electronic device of claim 15, wherein the $Mo_{1-x}W_xTe_2$ has an orthorhombic structure at the temperature equal to or lower than the threshold temperature.

17. The electronic device of claim 10, wherein the threshold temperature is at least 300 K.

18. The electronic device of claim 10, wherein resistance of the thin film material layer increases as temperature increases.

19. An electronic device comprising:
a thin film material layer including a first surface and a second surface opposing each other;
an upper electrode on the first surface of the thin film material layer; and
a lower electrode on the second surface of the thin film material layer,
wherein the thin film material layer includes $Mo_{1-x}W_xTe_2$ stacked in a plurality of layers, where x is at least 0.4 and less than 1,
the $Mo_{1-x}W_xTe_2$ has a thickness of about 1 nm to about 100 nm in a stacking direction,
the $Mo_{1-x}W_xTe_2$ has a symmetric lattice structure at a temperature higher than a threshold temperature,
the $Mo_{1-x}W_xTe_2$ has an asymmetric lattice structure at a temperature equal to or lower than the threshold temperature, and
the upper electrode and the lower electrode comprise graphite.

* * * * *